(12) United States Patent
Robinson et al.

(10) Patent No.: US 7,463,496 B2
(45) Date of Patent: Dec. 9, 2008

(54) LOW-PROFILE BOARD LEVEL EMI SHIELDING AND THERMAL MANAGEMENT APPARATUS AND SPRING CLIPS FOR USE THEREWITH

(75) Inventors: Kenneth M. Robinson, Effort, PA (US); James E. Kline, Blairstown, NJ (US)

(73) Assignee: Laird Technologies, Inc., St. Louis, MO (US)

( * ) Notice: Subject to any disclaimer, the term of this patent is extended or adjusted under 35 U.S.C. 154(b) by 279 days.

(21) Appl. No.: 11/415,461

(22) Filed: May 1, 2006

(65) Prior Publication Data

US 2007/0211445 A1 Sep. 13, 2007

Related U.S. Application Data

(60) Provisional application No. 60/780,797, filed on Mar. 9, 2006.

(51) Int. Cl.
*H05K 9/00* (2006.01)
(52) U.S. Cl. ..................... 361/818; 361/816
(58) Field of Classification Search ............ 361/810, 361/644, 641, 647, 752, 751; 174/257, 260–267; 439/34; 123/647, 679
See application file for complete search history.

(56) References Cited

U.S. PATENT DOCUMENTS

| | | | |
|---|---|---|---|
| 3,047,648 A | 7/1962 | Mowatt | |
| 3,208,511 A | 9/1965 | McAdam | |
| 3,572,428 A | 3/1971 | Monaco | |
| 3,721,746 A | 3/1973 | Knappenberger | |
| 4,203,488 A | 5/1980 | Johnson et al. | |
| 4,235,285 A | 11/1980 | Johnson et al. | |
| 4,345,267 A | 8/1982 | Corman et al. | |
| 4,405,961 A | 9/1983 | Chow et al. | |
| 4,433,886 A | 2/1984 | Cassarly et al. | |
| 4,481,525 A | 11/1984 | Calabro et al. | |
| 4,508,163 A | 4/1985 | McCarthy | |
| 4,661,888 A | 4/1987 | Jewell et al. | |
| 4,679,118 A | 7/1987 | Johnson et al. | |
| 4,729,426 A | 3/1988 | Hinshaw | |
| 4,754,101 A | 6/1988 | Stickney et al. | |
| 4,933,746 A | 6/1990 | King | |
| 5,052,481 A | 10/1991 | Horvath et al. | |
| 5,060,114 A | 10/1991 | Feinberg et al. | |
| 5,130,888 A | 7/1992 | Moore | |

(Continued)

FOREIGN PATENT DOCUMENTS

EP 0632686 8/1996

(Continued)

*Primary Examiner*—Jeremy C Norris
*Assistant Examiner*—Yuriy Semenenko
(74) *Attorney, Agent, or Firm*—Harness, Dickey & Pierce, P.L.C.

(57) ABSTRACT

According to various aspects of the present disclosure, exemplary embodiments are provided of low-profile apparatus capable of providing board level shielding for one or more electrical components while also providing dissipation of heat generated by the one or more electrical components. In one particular embodiment, an apparatus generally includes a resiliently compressible EMI gasket, a heat sink, and a spring clip. The spring clip has resilient legs with feet. The feet are configured to engage the board. When the feet are engaged with the board, a clamping force is generated that compressively biases the heat sink and the resiliently compressive EMI gasket generally towards the board.

36 Claims, 14 Drawing Sheets

U.S. PATENT DOCUMENTS

| | | | |
|---|---|---|---|
| 5,175,395 A | 12/1992 | Moore | |
| 5,175,613 A | 12/1992 | Barker, III et al. | |
| 5,208,731 A | 5/1993 | Blomquist | |
| 5,241,453 A * | 8/1993 | Bright et al. | 361/704 |
| 5,262,925 A * | 11/1993 | Matta et al. | 361/783 |
| 5,285,350 A | 2/1994 | Villaume | |
| 5,287,001 A | 2/1994 | Buchmann et al. | |
| 5,288,313 A | 2/1994 | Portner | |
| 5,295,043 A | 3/1994 | Beijer | |
| 5,329,426 A | 7/1994 | Villani | |
| 5,354,951 A | 10/1994 | Lange, Sr. et al. | |
| 5,357,404 A | 10/1994 | Bright et al. | |
| 5,365,399 A | 11/1994 | Kent et al. | |
| 5,367,433 A | 11/1994 | Blomquist | |
| 5,416,668 A | 5/1995 | Benzoni | |
| 5,485,037 A | 1/1996 | Marrs | |
| 5,524,908 A | 6/1996 | Reis | |
| 5,541,811 A | 7/1996 | Henningsson et al. | |
| 5,550,713 A | 8/1996 | Pressler et al. | |
| 5,552,635 A | 9/1996 | Kim et al. | |
| 5,566,052 A | 10/1996 | Hughes | |
| 5,640,047 A | 6/1997 | Nakashima | |
| 5,663,786 A | 9/1997 | Miyamori | |
| 5,706,579 A | 1/1998 | Ross | |
| 5,717,248 A | 2/1998 | Neumann et al. | |
| 5,717,577 A | 2/1998 | Mendolia et al. | |
| 5,763,824 A | 6/1998 | King et al. | |
| 5,804,875 A | 9/1998 | Remsburg et al. | |
| 5,811,050 A | 9/1998 | Gabower | |
| 5,866,943 A | 2/1999 | Mertol | |
| 5,893,409 A | 4/1999 | Kohler et al. | |
| 5,917,701 A | 6/1999 | Solberg | |
| 5,990,418 A | 11/1999 | Bivona et al. | |
| 6,005,186 A | 12/1999 | Bachman | |
| 6,025,991 A | 2/2000 | Saito | |
| 6,049,469 A | 4/2000 | Hood, III et al. | |
| 6,075,700 A | 6/2000 | Houghton et al. | |
| 6,122,167 A | 9/2000 | Smith et al. | |
| 6,166,918 A | 12/2000 | Olofsson et al. | |
| 6,178,097 B1 | 1/2001 | Hauk, Jr. | |
| 6,178,318 B1 | 1/2001 | Holmberg et al. | |
| 6,181,573 B1 | 1/2001 | Riet | |
| 6,195,267 B1 | 2/2001 | MacDonald, Jr. et al. | |
| 6,198,630 B1 * | 3/2001 | Cromwell | 361/704 |
| 6,205,026 B1 | 3/2001 | Wong et al. | |
| 6,208,515 B1 | 3/2001 | Klein | |
| 6,212,073 B1 | 4/2001 | Yamaguchi | |
| 6,269,008 B1 | 7/2001 | Hsu | |
| 6,347,035 B1 | 2/2002 | Hamano et al. | |
| 6,377,472 B1 | 4/2002 | Fan | |
| 6,377,475 B1 | 4/2002 | Reis | |
| 6,388,189 B1 | 5/2002 | Onoue | |
| 6,410,846 B1 | 6/2002 | Benn, Jr. | |
| 6,430,043 B1 | 8/2002 | Osburn | |
| 6,434,004 B1 * | 8/2002 | Matteson | 361/704 |
| 6,445,583 B1 | 9/2002 | Kline et al. | |
| 6,490,173 B2 | 12/2002 | Perkins et al. | |
| 6,501,018 B2 | 12/2002 | Mayer | |
| 6,504,095 B1 | 1/2003 | Hoffstrom | |
| 6,552,261 B2 | 4/2003 | Shlahtichman et al. | |
| 6,590,783 B2 | 7/2003 | Spratte et al. | |
| 6,624,432 B1 | 9/2003 | Gabower et al. | |
| 6,673,998 B1 | 1/2004 | Wu | |
| 6,674,653 B1 | 1/2004 | Valentine | |
| 6,676,137 B2 | 1/2004 | Dean | |
| 6,744,640 B2 | 6/2004 | Reis et al. | |
| 6,884,943 B1 * | 4/2005 | Gonzalez et al. | 174/260 |
| 6,943,287 B2 | 9/2005 | Lloyd et al. | |
| 6,944,025 B2 * | 9/2005 | Hockanson et al. | 361/719 |
| 6,946,598 B1 | 9/2005 | Konshak | |
| 6,965,071 B2 | 11/2005 | Watchko et al. | |
| 6,979,773 B2 | 12/2005 | Fursich | |
| 6,989,994 B2 | 1/2006 | Maguire et al. | |
| 7,013,558 B2 | 3/2006 | Bachman | |
| 2001/0046119 A1 | 11/2001 | Hamano et al. | |
| 2002/0181205 A1 * | 12/2002 | Shia et al. | 361/704 |
| 2003/0066672 A1 | 4/2003 | Watchko et al. | |
| 2004/0052064 A1 | 3/2004 | Oliver et al. | |
| 2005/0236171 A1 | 10/2005 | Garcia | |
| 2005/0237727 A1 | 10/2005 | Baker | |
| 2008/0083562 A1 * | 4/2008 | Kuczynski et al. | 174/350 |

FOREIGN PATENT DOCUMENTS

| | | |
|---|---|---|
| EP | 0910005 | 4/1999 |
| EP | 1364565 | 6/2002 |
| EP | 1493314 | 10/2006 |
| WO | WO 01/41521 | 6/2001 |
| WO | WO 02/069687 | 9/2002 |
| WO | WO 03/088729 | 10/2003 |

* cited by examiner

LOW-PROFILE BOARD LEVEL EMI SHIELDING AND THERMAL MANAGEMENT APPARATUS AND SPRING CLIPS FOR USE THEREWITH

CROSS-REFERENCE TO RELATED APPLICATION

This application claims the benefit of U.S. Provisional Application No. 60/780,797 filed Mar. 9, 2006, the disclosure of which is incorporated herein by reference.

FIELD

The present disclosure generally relates (but not exclusively) to low-profile apparatus that include spring clips and are capable of providing board level EMI shielding and dissipation of heat generated by one or more electrical components of a board.

BACKGROUND

The statements in this section merely provide background information related to the present disclosure and may not constitute prior art.

Electronic equipment includes electrical components and circuits that are mounted or supported on a substrate and that can be sensitive to electromagnetic interference (EMI) and radio frequency interference (RFI). Such EMI/RFI interference may originate from internal sources within the electronic equipment and/or from external EMI/RFI interference sources. Interference can cause degradation or complete loss of important signals, rendering the electronic equipment inefficient or inoperable. Accordingly, the circuits (sometimes referred to as RF modules or transceiver circuits) usually require EMI/RFI shielding in order to function properly. The EMI/RFI shielding can reduce interference not only from external sources, but also from various functional blocks within the module.

As used herein, the term "EMI" should be considered to generally include and refer to both EMI and RFI emissions, and the term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

By way of example, electronic circuits or components of a printed circuit board (PCB) are often covered with shields to localize EMI within its source and to insulate other devices proximal to the EMI source. Such shields may be soldered or otherwise affixed to the PCB, thus increasing the overall size of the PCB. Soldered shields, however, may need to be removed to repair or replace the covered component, which can be an expensive and time consuming task that can even cause damage to the PCB.

In addition, many electronic or electrical components generate significant amounts of heat (e.g., resistor, power transistor, microprocessor, etc.). Excessive heat build up can lead to reduced product life and reliability. Thus, various constructions have been proposed for removing heat generated by electronic or electrical components.

SUMMARY

According to various aspects of the present disclosure, exemplary embodiments are provided of low-profile apparatus capable of providing board level EMI shielding and dissipation of heat generated by one or more electrical components of a board. Other aspects relate to components of low-profile board level EMI shielding and thermal management assemblies. Further aspects relate to methods of using low-profile board level EMI shielding and thermal management assemblies. Additional aspects relate to methods of making low-profile board level EMI shielding and thermal management assemblies, and methods of making components thereof.

In one particular embodiment, an apparatus generally includes a resiliently compressible EMI gasket, a heat sink, and a spring clip. The spring clip has resilient legs with feet. The feet are configured to engage the board. When the feet are engaged with the board, a clamping force is generated that compressively biases the heat sink and the resiliently compressive EMI gasket generally towards the board.

Other exemplary embodiments include spring clips that can be used with low-profile board level EMI shielding and heat dissipation assemblies. In one such embodiment, a spring clip generally includes resilient legs downwardly depending from a connecting member. The connecting member and resilient legs can cooperatively define a generally inverted U-shaped profile. The resilient legs can have generally U-shaped feet for engaging a board supporting one or more electrical components. The connecting member can be resiliently biased to have a first generally concave configuration when the feet are disengaged from the board. But the connecting member can be flexed into a second generally flat configuration when the spring clip's feet are engaged with the board. This flexing of the resiliently biased connecting member into the second generally flat configuration can generate a clamping force generally between the connecting member and the board.

Further embodiments relate to methods of providing board level EMI shielding and dissipating heat from one or more electrical components of a board. In one such embodiment, a method generally includes positioning a generally inverted U-shaped spring clip having resilient legs relative to the board to engage generally U-shaped feet of the resilient legs with the board. The engagement of the feet with the board can apply a clamping force that compressively biases a heat sink and an EMI gasket generally towards the board.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
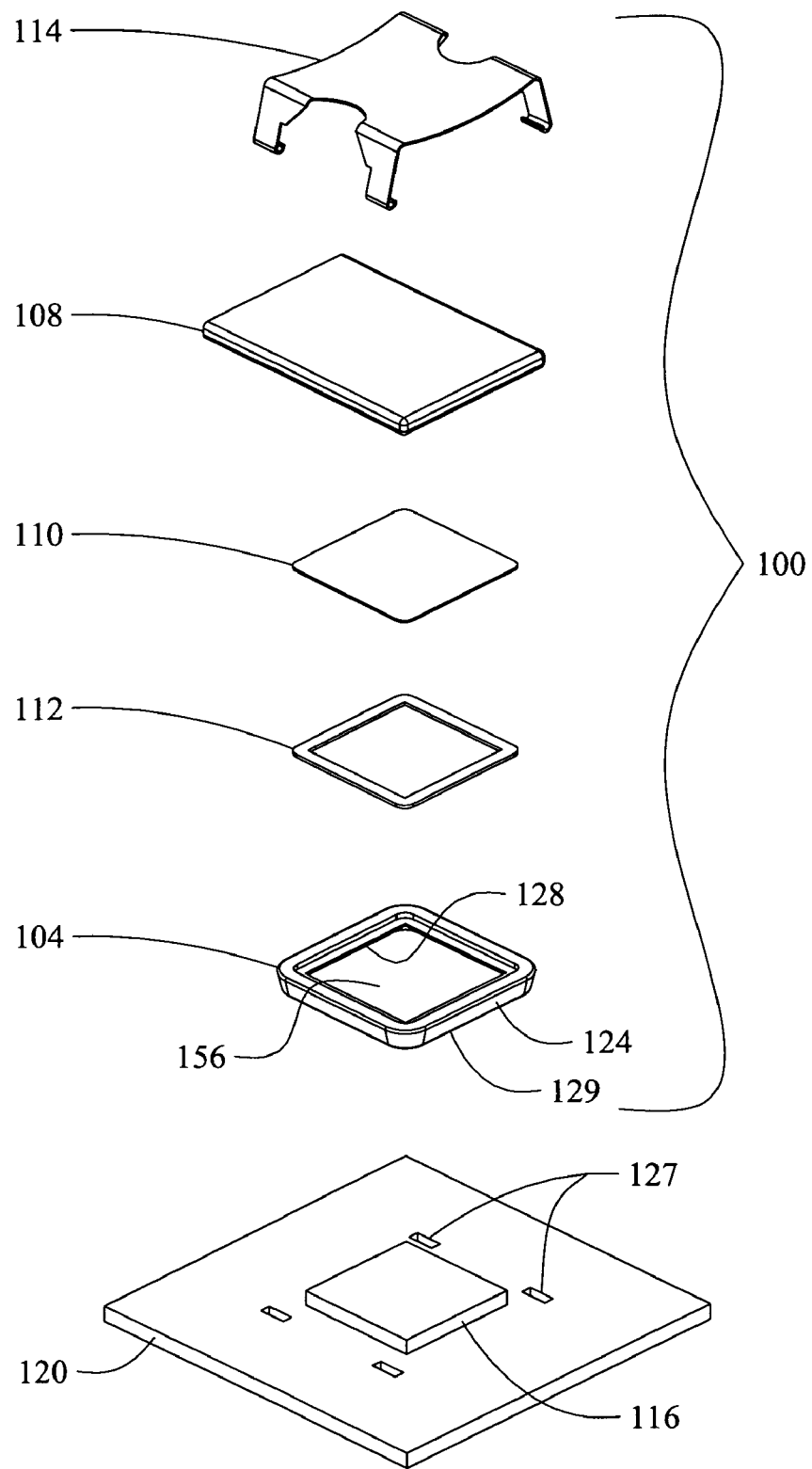
FIG. 1 is an exploded perspective view of a low-profile apparatus capable of providing board level EMI shielding and thermal management according to one exemplary embodiment.

The following description is merely exemplary in nature and is in no way intended to limit the present disclosure, application, or uses.

According to various aspects of the present disclosure, exemplary embodiments are provided of low-profile apparatus capable of providing board level EMI shielding and dissipation of heat generated by one or more electrical components of a board. Other aspects relate to components of low-profile board level EMI shielding and thermal management assemblies. Further aspects relate to methods of using low-profile board level EMI shielding and thermal management assemblies. Additional aspects relate to methods of making low-profile board level EMI shielding and thermal management assemblies, and methods of making components thereof.

In various embodiments, an apparatus generally includes a board level EMI shielding gasket (e.g., electrically-conductive elastomer, etc.) for electrically grounding the apparatus to a board, such as a printed circuit board, etc. The apparatus also includes one or more structures for dissipating heat generated by the one or more electrical components surface-mounted to or otherwise supported by the board. A heat dissipation structure can also be generally referred to herein as a heat sink or heat spreader.

In some embodiments, the heat sink can cooperate with the EMI gasket to provide EMI shielding and thermal management (e.g., heat dissipation and cooling, etc.) for the one or more electrical components (e.g., electronics package, circuits, etc.) over which the apparatus is disposed. A thermal interface (e.g., a thermal interface material, a pad of thermally-conductive material, etc.) can be disposed generally between the heat sink and the electrical component(s) being shielded. The thermal interface can help facilitate transfer of heat generated by the electrical component(s) to the heat sink.

In some embodiments, a thermal interface material and resiliently compressible EMI gasket can be coupled to or attached (e.g., adhesively attached, dispensed via form-in-place dispensing equipment, molded onto, etc.) to a carrier. Alternative embodiments can include low-profile EMI shielding and thermal management apparatus that do not include a separate carrier piece. In such embodiments, for example, one or more suitable materials can be coupled or attached directly to the heat sink, to thereby form a resiliently compressible EMI gasket and/or thermal interface. By way of example, various embodiments include electrically-conductive and thermally-conductive elastomer that is adhesively attached, dispensed via form-in-place dispensing equipment, and/or molded (e.g., overmolded onto, etc.) to the heat sink. In some embodiments, an electrically-conductive elastomer is attached directly to the heat sink to form a resiliently compressible EMI gasket, and another material is also attached to the heat sink to form a thermal interface. In such embodiments, the thermal interface material preferably comprises a more thermally-conductive material than the electrically-conductive elastomer used to form the EMI gasket, although this is not required for all embodiments.

In various embodiments of the shielding and thermal management apparatus, spring-action retaining devices (e.g., a spring clip, clamp, etc.) are used for providing the mechanical or clamping force for low thermal impedance. In such embodiments, the spring-action retaining device can have resilient legs and be generally referred to herein as a spring clip. Accordingly, various embodiments include spring clips having engagement members (e.g., U-shaped feet, etc.). The engagement members can be configured to engage a board, such as by positioned the engagement members through corresponding holes in a board and then engaging (e.g., hooking under, etc.) a lower surface of the board. This lower surface may be the bottommost surface of the board, but this is not required. Additionally, or alternatively, the spring clip's engagement members may be positioned generally around the sides of the board (instead of through holes in the board) to thereby engage the board's underside or a lower surface portion of the board. When the spring clip is installed and engaged to the board, a sufficient mechanical or clamping force can be generated for compressively biasing the heat sink generally towards the board. In this exemplary manner, the spring clip can help create and maintain sufficient contact for providing the EMI shielding and thermal management apparatus with low thermal impedance and good heat dissipation capacity.

In some embodiments, the biasing force applied by a spring clip can also help hold the heat sink down firmly against an EMI gasket and/or against a thermal interface. This, in turn, can help reduce any gaps, such as gaps between the EMI gasket and the heat sink, gaps between the heat sink and the thermal interface, and/or gaps between the EMI gasket and the board. Reducing (and, in some cases, eliminating) such gaps can thereby inhibit electromagnetic energy from passing through or leaking out through those gaps.

A wide range of materials can be used for any of the various components of an EMI shielding and thermal management apparatus. Some embodiments include a sheet metal heat sink and/or a sheet metal carrier. These and other embodiments can also include an EMI gasket formed from electrically-conductive elastomer, and a thermal interface formed from thermally-conductive elastomer (which may also be electrically conductive). The elastomer materials forming the EMI gasket and/or thermal interface can be provided (e.g., attached, adhesively attached, dispensed via form-in-place dispensing equipment, molded, overmolded, etc.) to a carrier and/or directly to a heat sink.

In those embodiments that include a carrier, the carrier can help maintain the plan-view shape of the EMI gasket when the EMI gasket is being compressed after installation of the spring clip. The carrier can also provide a surface for supporting (e.g., attaching, carrying, etc.) a thermal interface.

In one particular embodiment, an apparatus generally includes a resiliently compressible EMI gasket, a heat sink, and a spring clip. The spring clip has resilient legs with feet. The feet are configured to engage the board. When the feet are engaged with the board, a clamping force is generated that compressively biases the heat sink and the resiliently compressive EMI gasket generally towards the board.

Other exemplary embodiments include spring clips that can be used with low-profile board level EMI shielding and heat dissipation assemblies. In one such embodiment, a spring clip generally includes resilient legs downwardly depending from a connecting member. The connecting member and resilient legs can cooperatively define a generally inverted U-shaped profile. The resilient legs can have generally U-shaped feet for engaging a board supporting one or more electrical components. The connecting member can be resiliently biased to have a first generally concave configuration when the feet are disengaged from the board. But the connecting member can be flexed into a second generally flat configuration when the spring clip's feet are engaged with the board. This flexing of the resiliently biased connecting member into the second generally flat configuration can generate a clamping force generally between the connecting member and the board.

Further embodiments relate to methods of providing board level EMI shielding and dissipating heat from one or more electrical components of a board. In one such embodiment, a method generally includes positioning a generally inverted U-shaped spring clip having resilient legs relative to the board to engage generally U-shaped feet of the resilient legs with the board. The engagement of the feet with the board can apply a clamping force that compressively biases a heat sink and a resiliently compressive EMI gasket generally towards the board.

FIGS. 1 through 4 illustrate an exemplary combined low-profile EMI shielding and thermal management apparatus 100 embodying one or more aspects of the present disclosure. As shown, the apparatus 100 generally includes a resiliently compressible EMI gasket 104, a heat sink 108, a thermal interface 110, a carrier 112, and a spring clip 114.

Figure 3A:
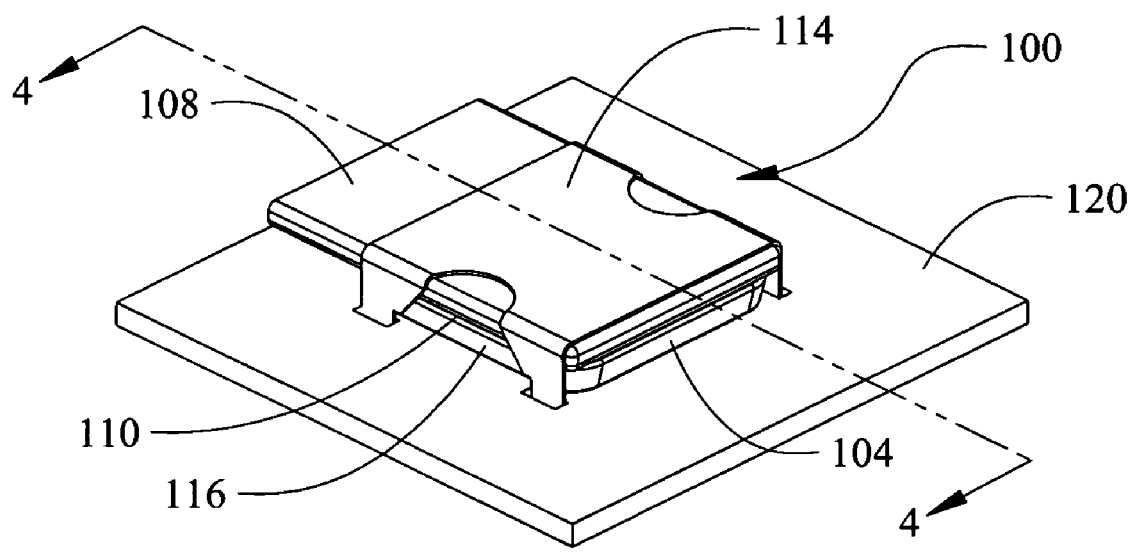
FIGS. 3A and 3B are respective upper and lower perspective views of the apparatus shown in FIGS. 1 and 2 after the apparatus has been disposed over an electrical component of a board to thereby provide EMI shielding and heat dissipation.
Figure 3B:
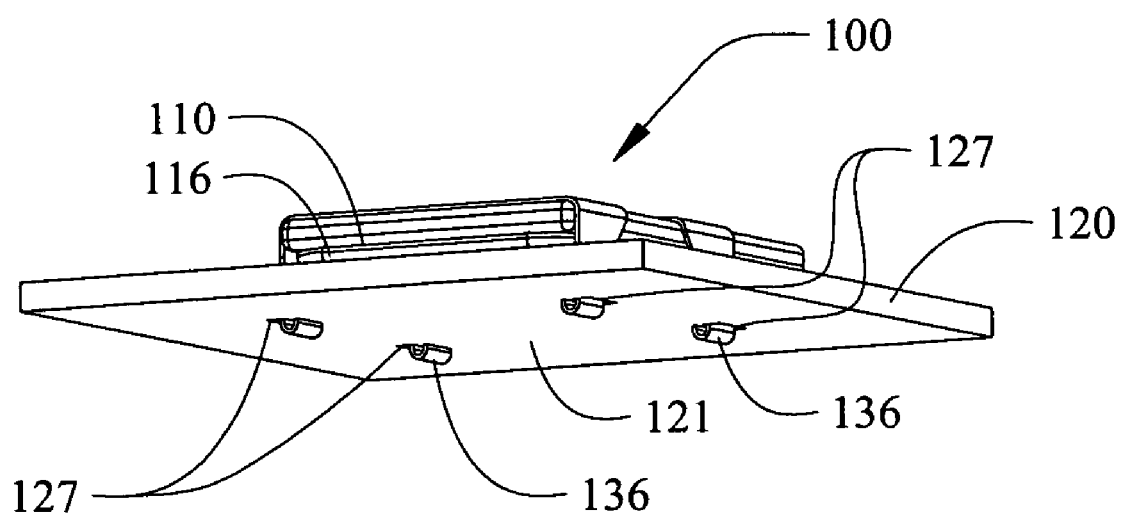
Figure 4:
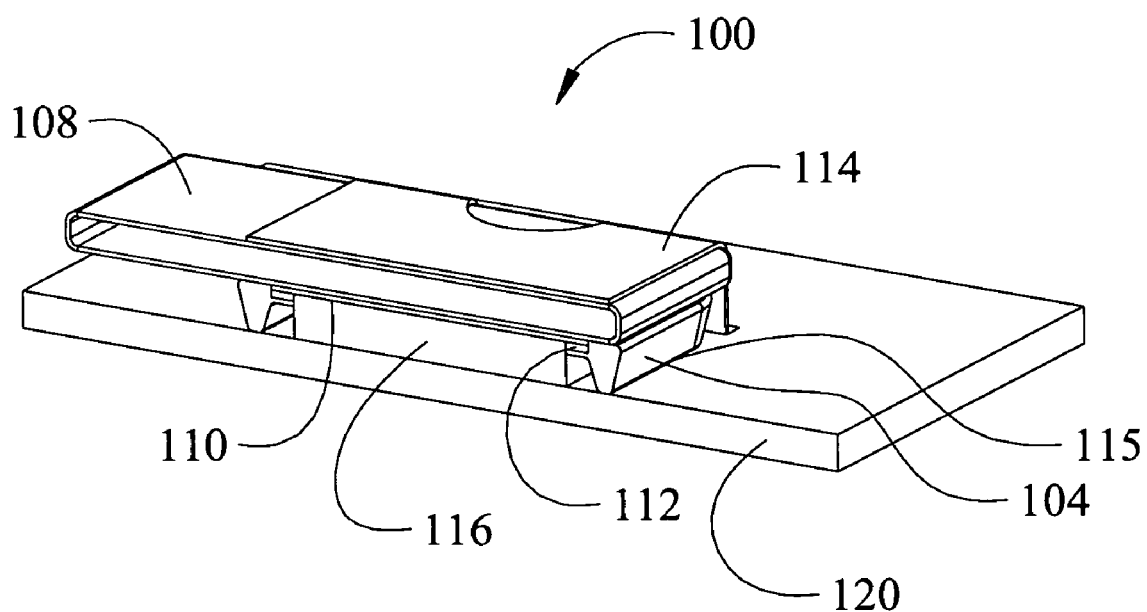
FIG. 4 is a cross-sectional view of the apparatus shown in FIG. 3A taken along sectional line 4-4 in FIG. 3A.

FIGS. 3 and 4 illustrate the apparatus 100 disposed over an electrical component 116, which, in turn, is surface-mounted to (or otherwise supported by) the board 120. The apparatus 100 can shield the electrical component 116 and dissipate heat generated by the electrical component 116. For example, the apparatus 100 can shield the electrical component 116 from electromagnetic interference (EMI) emitted from other components (not shown) external to the apparatus 100 and/or prevent EMI emitted by the electrical component 116 from interfering with other electronic or electrical components (not shown) external to the apparatus 100. The apparatus 100 can be used with a wide range of electrical components, such as surface-mounted electronic components, electronics packages, and integrated circuits of a printed circuit board, etc.

Figure 2:
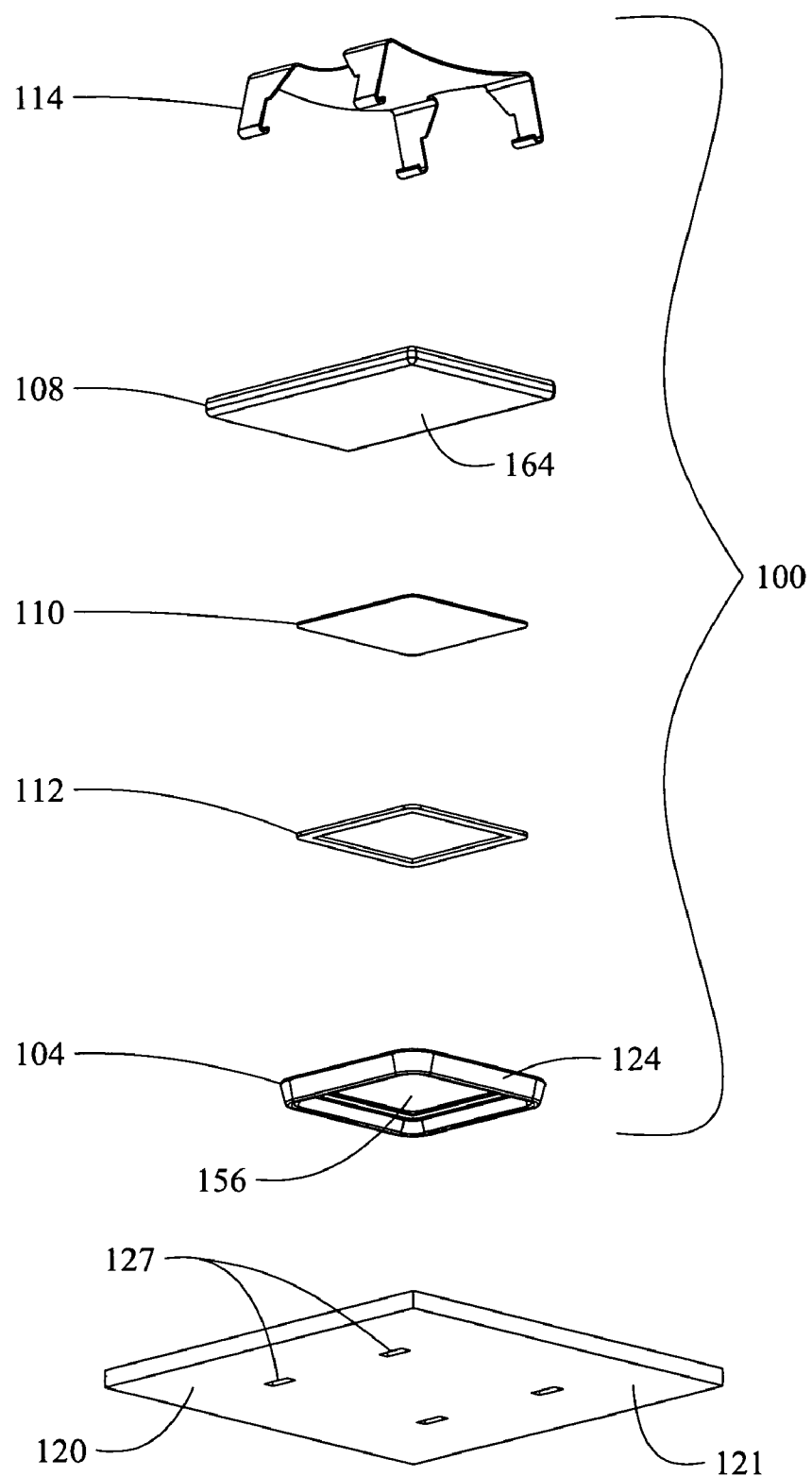
FIG. 2 is an exploded lower perspective view of the apparatus shown in FIG. 1.

As shown in FIGS. 1 and 2, the EMI gasket 104 generally includes peripheral walls 124. While the illustrated EMI gasket 104 includes four peripheral walls 124 in a generally rectangular configuration, other embodiments can include an EMI gasket having more or less than four peripheral walls and/or peripheral walls in a non-rectangular configuration (e.g., triangular, hexagonal, circular, etc.).

Each gasket wall 124 includes an inwardly extending shoulder 128. The shoulders 128 provide surfaces along which the carrier 112 can be disposed, attached, adhered, supported, etc. The shoulders 128 can allow for easier handling and assembly of the apparatus 100. Alternative embodiments provide combined low-profile EMI shielding and thermal management apparatus that do not include a separate carrier. For example, FIGS. 9 through 12 illustrate an apparatus 200 in which a thermal interface 210 (e.g., thermally-conductive elastomer (which may be electrically conductive or non-conductive), etc.) is provided directly on or to the heat sink 208. In such embodiments, the thermal interface 210 can be adhesively attached, dispensed via form-in-place dispensing equipment, and/or molded (e.g., overmolded onto, etc.) to the heat sink 208. Also shown in FIGS. 9 through 12, the apparatus 200 further includes an EMI gasket 204 and a spring clip 214.

Referring back to FIGS. 1 and 2, the EMI gasket 104 also includes a relatively open upper surface or window 156. The EMI gasket 104 is configured such that the lower edges 129 of the walls 124 are generally straight. The edges 129 can provide suitable surfaces for contacting and abutting against the board 120, whereby such contact or abutment can ground the apparatus 100 to the board 120.

A wide range of materials can be used for the EMI gasket 104, which are preferably resiliently compressible. In one preferred embodiment, the EMI gasket 104 is molded from an electrically-conductive elastomer. Alternatively, the EMI gasket 104 can be formed from other materials and/or with other manufacturing processes. By way of example, other embodiments include an EMI gasket formed from sheet metal or wire mesh.

In various preferred embodiments, the EMI gasket 104 can also be made of one or more materials having sufficient resiliency or flexibility to permit the EMI gasket 104 to be deflected at least partially against ground traces 115 (FIG. 4) of the board 120. This deflection can help reduce (and, in some cases, eliminate) any gaps between the EMI gasket 104 and the board 120 after installation of the spring clip 114. This, in turn, can inhibit electromagnetic energy from passing through or leaking out through the interface between the EMI gasket 104 and the board 120.

In various embodiments, the EMI gasket 104 is formed of a material that allows for compression or deflection of the EMI gasket 104 between about twenty percent and about fifty percent of the gasket's free or uncompressed height. In some embodiments, the design of the EMI gasket 104 can be formed to have the inherent or built-in ability to handle assembly tolerances. Alternatively, other suitable configurations (e.g., shapes, sizes, etc.), materials, and manufacturing methods can be used for making the EMI gasket 104.

The apparatus 100 further includes the heat sink 108. This heat sink 108 can help dissipate, remove, and/or spread heat generated by the electrical component 116. In addition, the heat sink 108 can also operate in cooperation with the EMI gasket 104 to provide shielding for the electrical component 116.

As shown in FIGS. 3 and 4, a portion of the heat sink 108 can be disposed generally over the interposed thermal interface 110 and the EMI gasket 104. Accordingly, the heat sink 108 and/or thermal interface 110 can function as a lid for covering the window 156 of the EMI gasket 104. In this exemplary manner, the EMI gasket 104 and the heat sink 108 and/or thermal interface 110 can cooperatively provide EMI shielding for the electrical component 116 over which the apparatus 100 is disposed.

In the illustrated embodiment shown in FIG. 4, the heat sink 108 comprises a heat pipe having a generally hollow interior, which is preferably filled with fluid. In some embodiments, the heat pipe may also include relatively fine grooves along the inner surface thereof. Alternatively, other configurations are possible for the heat sink 108. For example, the heat sink 108 may comprise a piece of generally flat sheet metal. Further heat sink embodiments can include a heat dissipation surface integrally formed with another component of the apparatus, where the heat dissipation surface extends outwardly away from the EMI gasket walls. Further embodiments can include solid heat sinks and/or heat sink structures having other shapes and sizes.

The heat sink 108 can be formed from a wide variety of materials via various manufacturing methods. Preferably, the heat sink material(s) are good thermal conductors, and, in some embodiments, also good EMI shielding materials. In various embodiments, the heat sink 108 can be integrally or monolithically formed as a single component structure by bending or folding a piece of sheet metal. Alternatively, other exemplary manufacturing methods and materials can be used for the heat sink 108, such as beryllium copper alloys, aluminum, brass, phosphor bronze, etc. In some embodiments, the heat sink 108 may comprise bare or uncoated metal. In some other embodiments, the heat sink 108 may comprise a metal coated with a suitable electrically-conductive plating to provide galvanic compatibility with the EMI gasket 104.

FIGS. 5 through 8 illustrate an exemplary spring clip 114 that can be used in the apparatus 100. Spring clip 114 can be configured for providing the mechanical or clamping force for low thermal impedance. As shown in FIGS. 3 and 4, the spring clip 114 can be configured for compressively biasing the heat sink 108 generally towards the board 120. In this exemplary manner, the spring clip 114 can help create and maintain sufficient contact for providing the apparatus 100 with low thermal impedance and good heat dissipation capacity.

In some embodiments, the biasing force applied by the installed spring clip 114 can also help hold the heat sink 108 down firmly against the EMI gasket walls 124 and/or against the thermal interface 110. This, in turn, can help reduce (and, in some cases, eliminate) any gaps between the various components, such as gaps between the EMI gasket 104 and the board 120 and gaps between the EMI gasket 104 and the heat sink 108. Accordingly, the clamping force applied by the installed spring clip 114 can help inhibit electromagnetic energy from passing into or leaking out of the interior defined within the EMI gasket walls 124.

With continued reference to FIGS. 5 through 8, the illustrated spring clip 114 includes a connecting member 130 and resilient legs 132 depending downwardly and outwardly from the connecting member 130. The legs 132 have feet or engagement portions 136. The feet 136 are configured to resiliently engage or clip under a lower surface 121 of the board 120 (FIG. 3B). As shown, the lower surface 121 comprises the bottom of the board 120 (but this is not required).

In the particular illustrated embodiment (FIG. 3B), the board 120 includes holes or openings 127 configured to receive therethrough the spring clip's feet 136. After the feet 136 are positioned through the holes 127, the feet 136 may then engage the board's lower surface 121. Alternatively, the apparatus 100 may also be used with boards that do not have any such openings or holes 127. In such alternative embodiments, the spring clip's engagement members or feet can be configured to be positioned generally around the sides of the board (instead of through holes in the board) to thereby engage the board's underside or lower surface 121.

Figure 7:
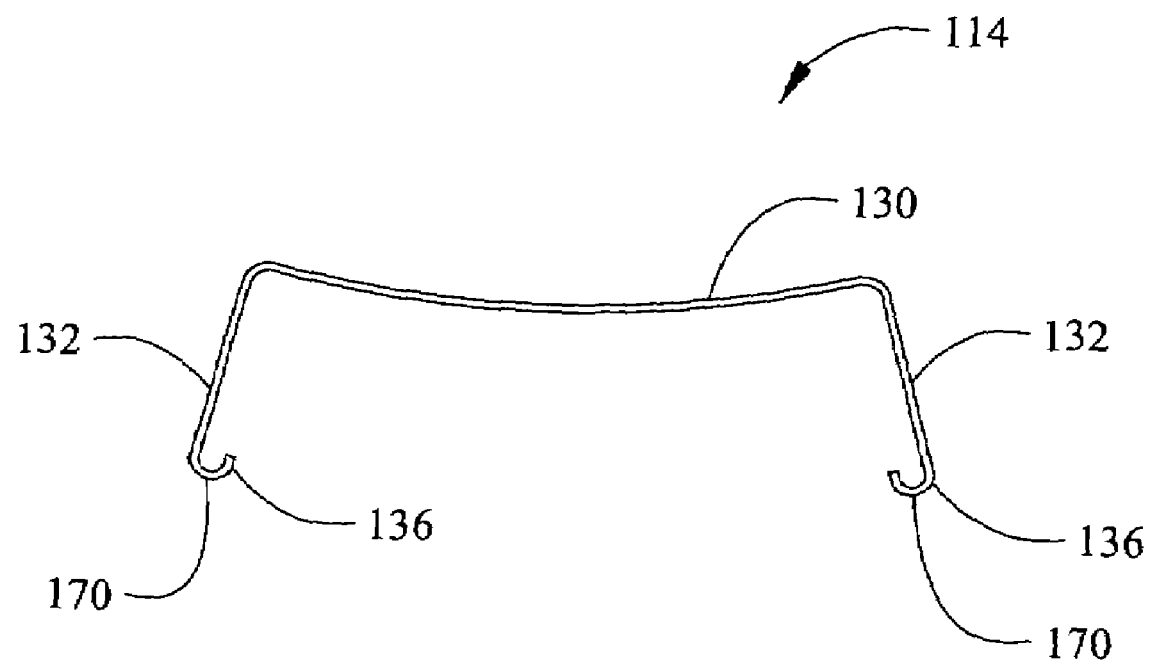
FIG. 7 is a front elevation view of the spring clip shown in FIG. 5.
Figure 8:
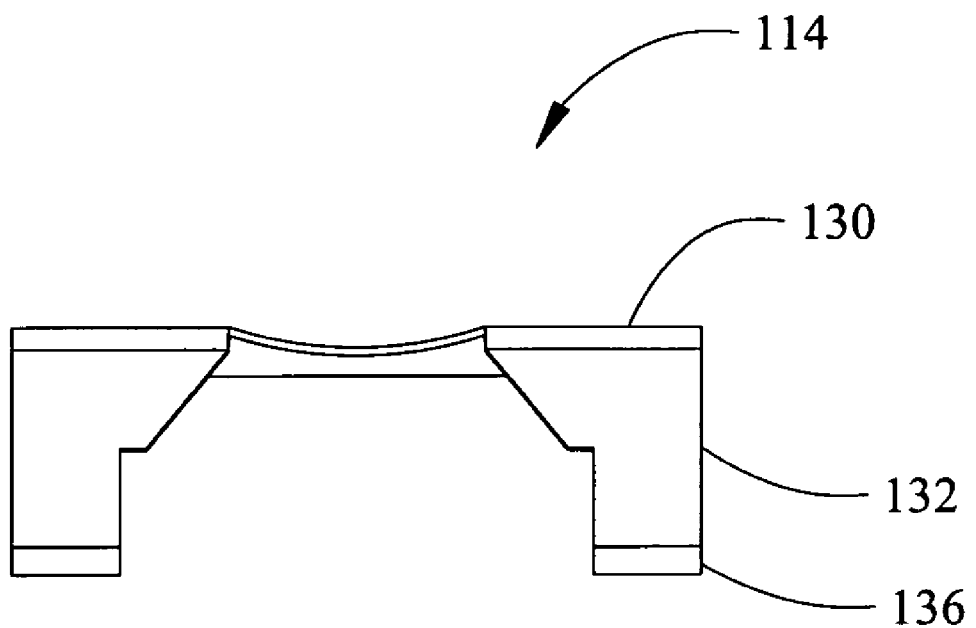
FIG. 8 is a side elevation view of the spring clip shown in FIG. 5.
Figure 9:
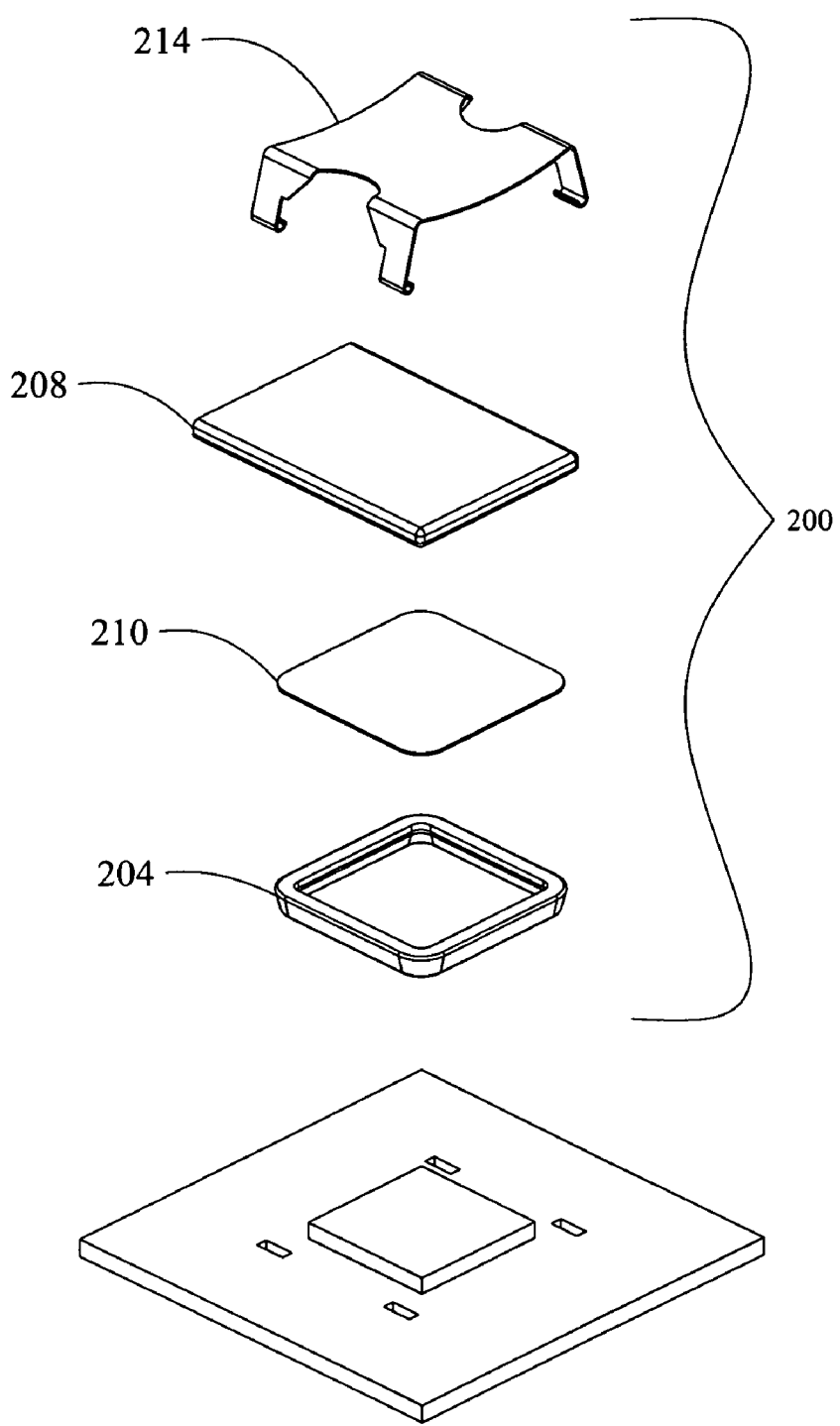
FIG. 9 is an exploded perspective view of a low-profile apparatus capable of providing board level EMI shielding and thermal management according to another exemplary embodiment.
Figure 10:
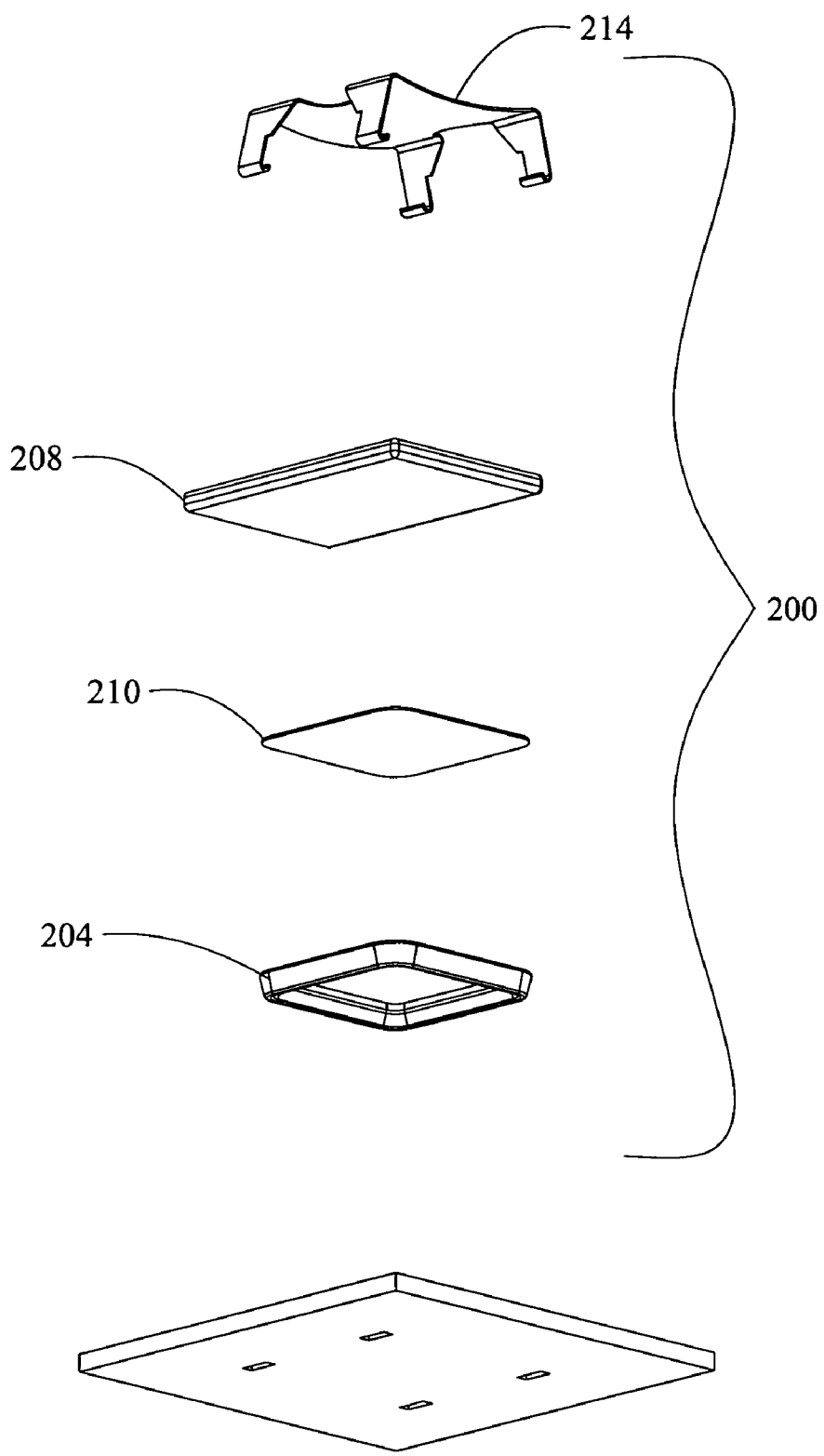
FIG. 10 is an exploded lower perspective view of the apparatus shown in FIG. 9.
Figure 11:
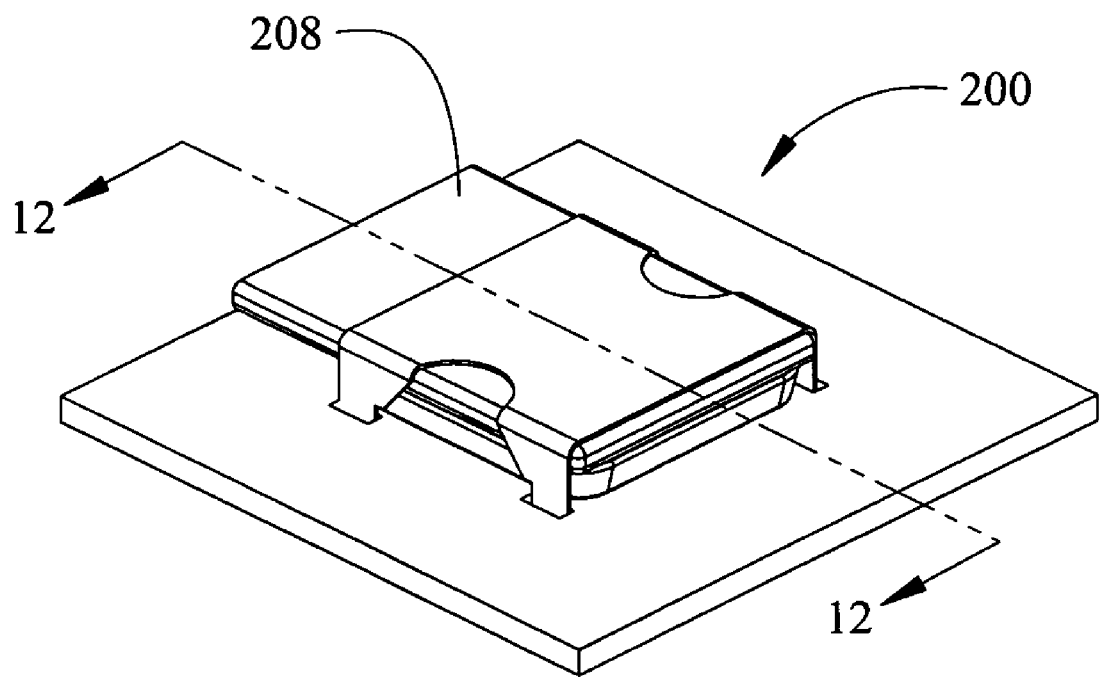
FIG. 11 is a perspective view of the apparatus shown in FIGS. 9 and 10 after the apparatus has been disposed over a electrical component of a board to thereby provide EMI shielding and heat dissipation.
Figure 12:
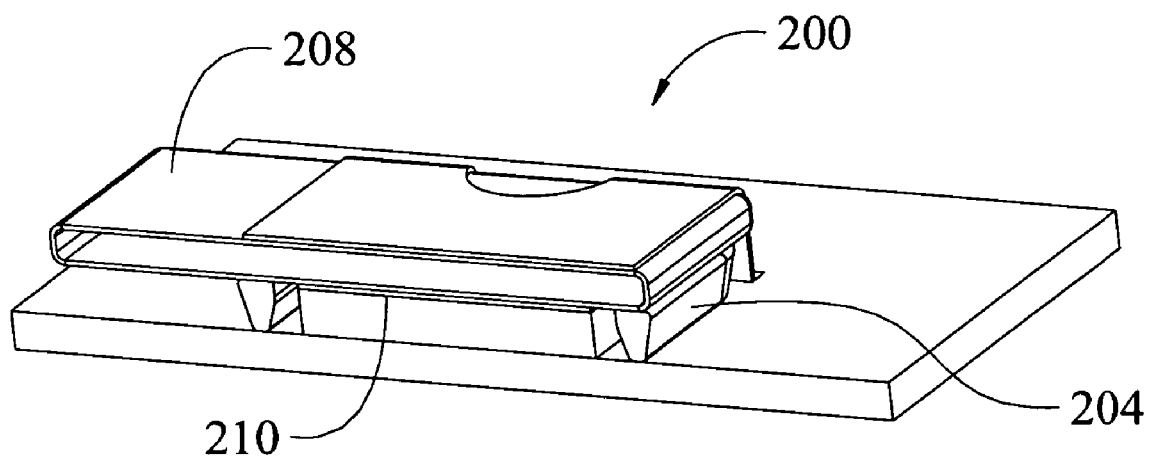
FIG. 12 is a cross-sectional view of the apparatus shown in FIG. 11 taken along the line 12-12 in FIG. 11.

The resilient engagement of the spring clip's feet 136 with the lower surface 121 of the board 120 can flex, deflect and/or deform the connecting member 130. In this particular embodiment, the connecting member 130 is resiliently biased into a first generally concave configuration (FIG. 7). But the connecting member 130 can be resiliently flexed, deflected and/or deformed into a second generally flat configuration (FIGS. 3 and 4). This flexing of the resiliently biased connecting member 130 can create a clamping force that is applied generally between the board 120 and the connecting member 130.

Figure 5:
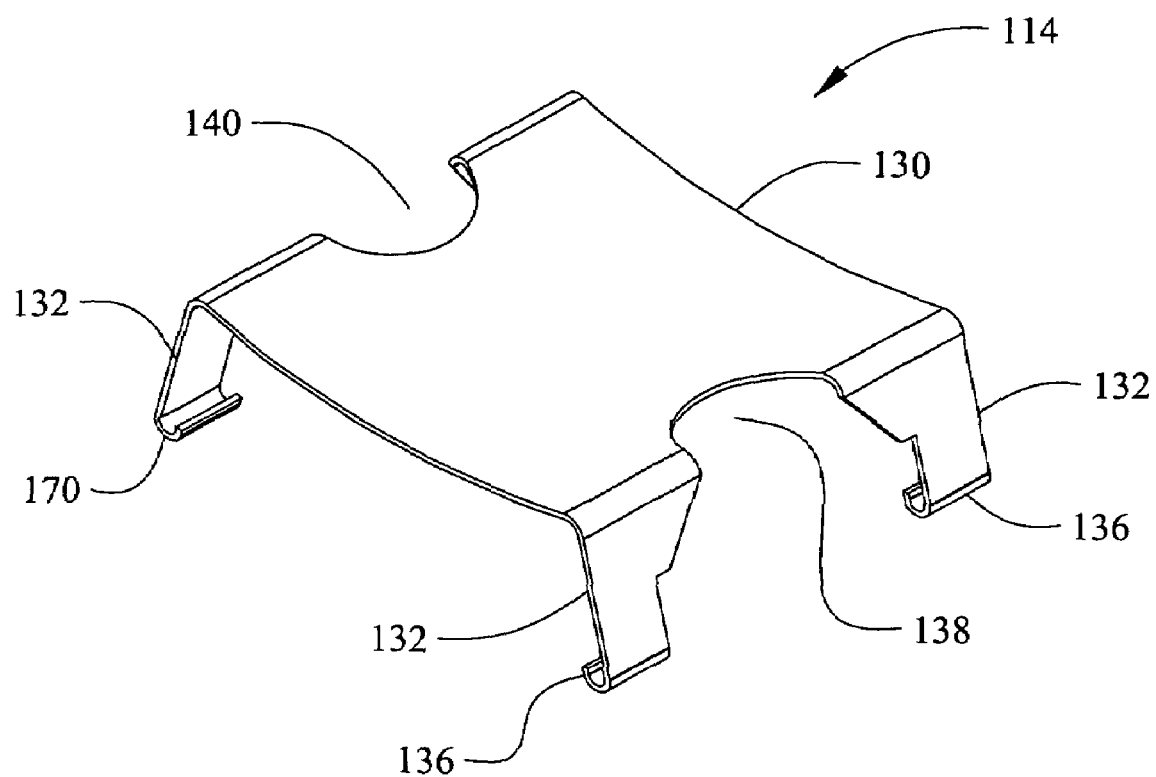
FIG. 5 is a perspective view of the spring clip shown in FIG. 1.
Figure 6:
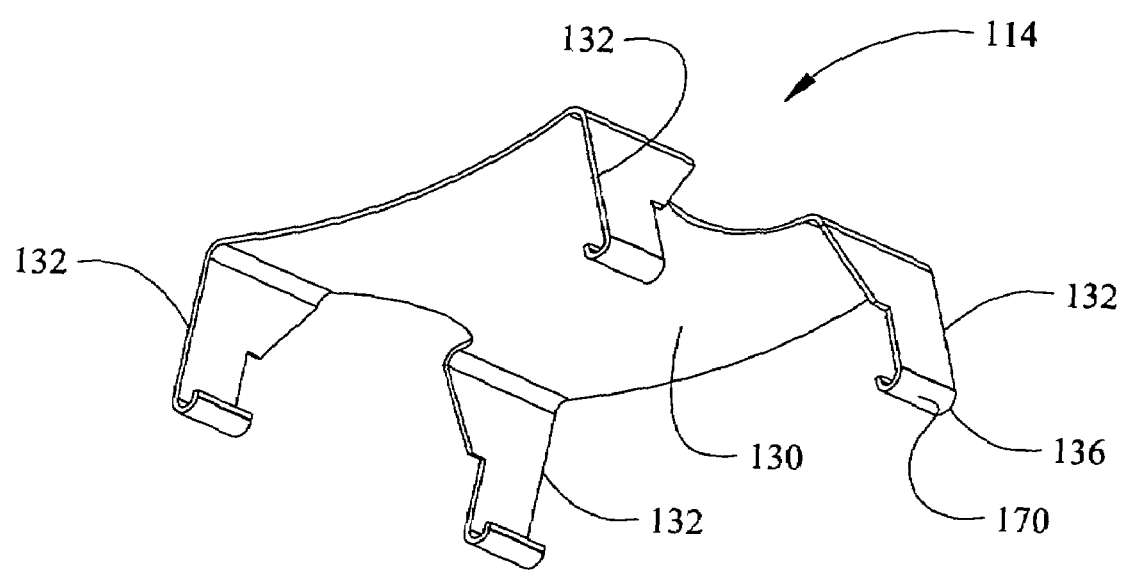
FIG. 6 is a lower perspective view of the spring clip shown in FIG. 5.

As shown in FIG. 7, the connecting member 130 has a generally concave or U-shaped profile when the spring clip's feet 136 are not engaged to the board 120. In addition, FIG. 5 illustrates the upper surface of the connecting member 130 as being generally rectangular with two semicircular cutout portions 138 and 140. In some embodiments, the semicircular cutout portions 138 and 140 can be configured (e.g., shaped, sized, positioned, etc.) for enhancing flexibility of the legs 132 and/or flexibility of the connecting member 130. Alternatively, other configurations (e.g., shapes, sizes, etc.) are possible for the connecting member 130.

With continued reference to FIG. 7, the spring clip's legs 132 depend or extend outwardly at a slant relative to the connecting member 130. This generally outward tapering or flaring allows the legs 132 to become vertical and spaced to line up with the board at the proper locations when the connecting member 130 is flexed from its first generally concave configuration into the second generally flat configuration. Alternative spring clip embodiments can include one or more legs extending or depending generally straight down or perpendicular relative to the member 130 or that extend inwardly relative to the member 130. In addition, further embodiments can include a spring clip having more or less than four legs and/or one or more legs having a different configuration (e.g., shape, size, etc.).

Figure 13:
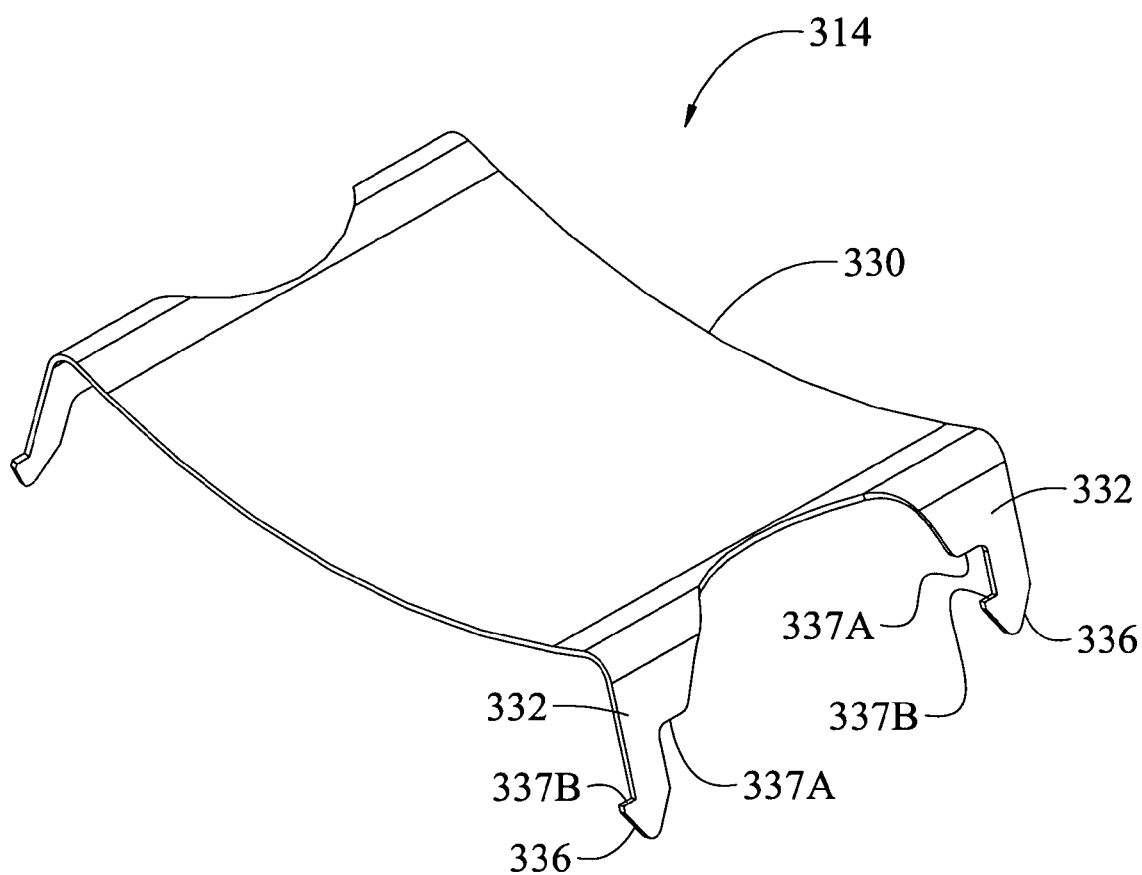
FIG. 13 is a perspective view of a spring clip according to another exemplary embodiment.

With continued reference to FIGS. 5 through 8, the legs 132 have engagement members 136 comprising inward foot-like extensions with generally U-shaped transverse profiles. While the illustrated embodiment shows the feet 136 with generally U-shaped cross-sections or transverse profiles, other cross-sectional shapes (e.g., L-shaped, angularly truncated U-shaped, etc.) are also possible depending, for example, on the particular application in which the apparatus 100 will be used. For example, FIG. 13 illustrates a spring clip 314 having an alternative foot topology or configuration that is described in more detail below.

With reference back to FIG. 3B, after the feet 136 are engaged or clipped under the board 120 (FIG. 3B), the profile of the connecting member 130 has been changed, flexed, or deformed from its generally concave inverted U-shaped profile (FIG. 7) to a more flat profile (FIG. 3). In various embodiments, the spring clip 114 is formed from a material having sufficient resiliency or springiness to permit the profile change of the connecting member 130 for allowing the legs 132 to be moved downwardly for positioning and clipping the feet 136 generally under the board 120, and then to respond with a sufficient restorative force (after the feet 136 are disposed underneath the board 120) such that the spring clip 114 biases the heat sink 108 generally towards the EMI gasket 104, thermal interface 110, carrier 112, electrical component 116, and board 120 in the illustrated embodiment. In one particular embodiment, the spring clip 114 is formed from sheet metal having a thickness of about 0.20 millimeter. Alternatively, other suitable materials can be used for the spring clip 114.

After the feet 136 have been engaged or clipped under the board 120 (FIG. 3), the resiliency or springiness of the spring clip 114 can thus apply a compressive biasing pressure forcing the heat sink 108 downward onto the thermal interface 110. Accordingly, this biasing pressure applied by the spring clip's foot-like end portions 136 can help hold the heat sink 108 down firmly against the thermal interface 110, thereby helping retain good thermal contact between the heat sink 108 and thermal interface 110 and between the thermal interface 110 and the electrical component 116. In some embodiments, the biasing force applied by the spring clip's feet 136 (when engaged with the lower board surface 121) can also help hold the heat sink 108 down firmly against the EMI gasket walls 124. This, in turn, can help reduce any gaps between the EMI gasket 104 and the heat sink 108, thereby inhibiting electromagnetic energy from passing through or leaking out through the interface between the heat sink 108 and the EMI gasket 104. Accordingly, the clamping force applied by the installed spring clip 114 can help inhibit electromagnetic energy from passing into or leaking out of the interior defined within the EMI gasket walls 124.

In some embodiments, the lower surfaces 170 of the spring clip's legs 132 can also operate as cam surfaces. In such embodiments, contact between the curved lower surfaces 170 of the spring clip legs 132 and the board 120 can urge the legs 132 generally outwards. This, in turn, can allow the leg end portions 136 to slide generally through the holes 127 and/or generally over sides of the board 120. After the feet 136 clear the lower board surface 121, the feet 136 may then spring generally inwardly to thereby engage or interlock with the lower surface 121 of the board 120.

In the illustrated embodiment of FIGS. 1 through 4, the apparatus 100 includes the thermal interface 110 disposed between the heat sink 108 and electrical component 116. The thermal interface 110 can comprise one or more separate layers disposed on the electrical component 116 and/or one or more separate layers disposed on the lower surface 164 of the heat sink 108.

A wide variety of materials can be used for the thermal interface 110. In one preferred embodiment, the thermal interface 110 comprises molded thermally-conductive elastomer. The thermally-conductive elastomer can be electrically conductive, or it can also be electrically non-conductive. In some embodiments, the thermal interface 110 is formed from ceramic or metal particle filled elastomer materials. Alternative embodiments can include a thermal interface formed from ceramic particles, ferrite electromagnetic interference/radio frequency interference (EMI/RFI) absorbing materials, metal, fiberglass meshes in a base of rubber, gel, grease, or wax, etc. Alternative embodiments can provide an apparatus that does not include a separate thermal interface 110. In such embodiments, the heat sink can make direct physical contact with and abut against the one or more electrical or electronic components over which the apparatus is disposed.

In order to further illustrate various aspects and possible advantages thereof, the following example is given for purposes of illustration only and not for purposes of limitation. In this particular example, the components are configured to have the following height dimensions when the spring clip 114 is unclipped from the board 120: a board 120 having a height of about 1 millimeter, an electrical component 116 having a height of about 0.65 millimeters, a heat sink 108 having a height of about 1.3 millimeters (or about 0.2 millimeter when formed with a generally flat piece of sheet metal), a thermal interface 110 having a height of about 0.13 millimeters, an EMI gasket 104 having a height of about 1.0 millimeter, and a spring clip 114 having a sheet metal thickness of about 0.20 millimeters. Continuing with this example, and after the spring clip 114 has been installed with its feet 136 engaged or clipped under the lower board surface 121, the overall (compressively reduced) height above the board 120 can be about 2.3 millimeters (or about 1.2 millimeters when the heat sink 108 is formed with a generally flat piece of sheet metal). Alternatively, lower overall heights can be achieved depending, for example, on the deflection needs for the EMI gasket 104 and on the height of the electrical component 116. In addition, the installed spring clip 114 in the above example can apply a clamping force of about 130 Newtons or 30 pounds, which in some embodiments may be sufficient for facilitating thermal pad wet-out or elimination (or at least reduction) of air gaps for providing efficient heat transfer. This clamping force can be distributed between the EMI gasket 104 and the thermal interface 110. The dimensions and other numerical values provided in this paragraph (as are all dimensions and numerical values set forth herein) are for purposes of illustration only, as the apparatus and components thereof can be configured with different dimensions and/or for providing operational parameters with different numerical values depending, for example, on the particular application, such as the component(s) to be shielded, space considerations within the overall apparatus, EMI shielding and heat dissipation needs, and other factors. For example, the material and thickness used for the spring clip 114 can be varied to change the amount of clamping force applied by the installed spring clip 114 to the apparatus 100. By way of example, a spring clip may be configured for applying about 0.14 Megapascal or 20 pounds per square inch of pressure to the thermal interface, which in some embodiments may be generally sufficient for good thermal performance. Or, for example, a spring clip 114 can be configured for applying a force of about 24 Newtons or 5.5 pounds per square inch to the thermal interface, when the apparatus is being used with an electrical component 116 that is 12 millimeters by 12 millimeters. In addition, various embodiments can provide assemblies having EMI shielding performance of about one hundred decibels at ten gigahertz and with about fifty percent compression of the EMI gasket 104 relative to the EMI gasket's free height.

For example, FIG. 13 illustrates a spring clip 314 having an alternative foot topology or configuration, which is described in more detail below. In this particular example, the spring clip 314 again include legs 332 depending from a connecting member 330 having a generally concave or U-shaped profile when the spring clip's feet 336 are not engaged to a board.

In this illustrated embodiment, however, the spring clip's feet 336 are configured to be inserted through holes in a board, and then be slidably moved relative to the board in order to capture and engage the board generally between upper and lower shoulder portions or stops 337A, 337B of the spring clip 330. With the board captured and engaged generally between the upper and lower shoulder portions 337A and 337B, the spring clip 314 can be resiliently flexed, deflected and/or deformed from the generally concave configuration shown in FIG. 13 to a more generally flat configuration. This flexing of the resiliently biased connecting member 330 can create a clamping force that is applied generally between the board and the connecting member 330.

In one particular embodiment, the spring clip 314 is formed from sheet metal such that the feet 336 are generally flat and hook-shaped as shown in FIG. 13. Alternatively, other materials, shapes, and configurations can also be used for the spring clip 314.

Advantageously, various embodiments can thus allow cost savings to a customer/manufacturer. This is because a customer/manufacturer can purchase a combined EMI shielding and thermal management apparatus (e.g., as a kit, etc.) instead of purchasing separate apparatus to respectively provide EMI shielding and to provide thermal management.

In addition, various embodiments can provide for EMI shielding and thermal management of relatively small electrical components and circuit board layouts, such as the electronic components and circuit board layouts associated with cellular telephones and other wireless/RF devices. As electronic components and layouts are decreasing in size, various embodiments are able to help meet the needs of increasing heat dissipation from such small electronic components and layouts.

Certain terminology is used herein for purposes of reference only, and thus is not intended to be limiting. For example, terms such as "upper", "lower", "above", "below", "front", "back", "rear", "bottom", and "side" can refer to directions in the drawings to which reference is made and/or can describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the methods "steps", "processes", and "operations" thereof described herein are not to be construed as necessarily requiring their performance in the particular order discussed or illustrated, unless specifically identified as an order or performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A low-profile apparatus for providing board level EMI shielding and dissipating heat from one or more electrical components of a board, the apparatus comprising a resiliently compressible EMI gasket having a perimeter, a heat sink, and a generally inverted U-shaped spring clip including resilient legs, the resilient legs having feet for engaging the board, whereby engagement of the feet with the board applies a clamping force for compressively biasing the heat sink and the resiliently compressive EMI gasket generally towards the board, wherein the resilient legs include upper and lower stops configured for cooperatively capturing at least a portion of the board therebetween, and wherein the feet are configured for positioning through corresponding holes in the board to thereby allow the upper and lower stops to be positioned along generally opposite upper and lower surface portions of the board.

2. The apparatus of claim 1, wherein the feet include hook-shaped members configured for positioning through corresponding holes in the board to engage a lower portion of the board.

3. The apparatus of claim 1, wherein the feet include generally U-shaped members configured to be hooked generally under a lower portion of the board.

4. The apparatus of claim 1, wherein the resilient legs extend generally outwardly and downwardly from a connecting member, the outward flaring of the resilient legs allowing the resilient legs to become generally vertical when the connecting member is flexed from a first generally concave configuration into a second generally flat configuration.

5. The apparatus of claim 1, wherein the resilient legs are connected by a connecting member configured for contacting and applying pressure to the heat sink when the feet are engaged to the board, the connecting member being resiliently biased to have a first generally concave configuration when the feet are disengaged from the board, and wherein the connecting member flexes into a second generally flat configuration when the feet are engaged with the board, whereby flexing of the connecting member into the second generally flat configuration generates a compressive clamping force applied generally between the connecting member and the board.

6. The apparatus of claim 1, wherein the resilient legs are connected by a connecting member configured for contacting and applying pressure to the heat sink when the feet are engaged to the board, the connecting member being resiliently biased to have a first configuration when the feet are disengaged from the board, and wherein the connecting member flexes into a second configuration when the feet are engaged with the board, whereby flexing of the connecting member into the second configuration generates a compressive clamping force applied generally between the connecting member and the board.

7. The apparatus of claim 1, wherein the apparatus is configured such that engagement of the feet with the board portion compresses the resiliently compressive EMI gasket against the board for grounding the apparatus.

8. The apparatus of claim 1, wherein the spring clip includes an upper portion having generally opposing side edges from which at least two resilient legs downwardly depend with a semicircular cutout portion disposed therebetween.

9. The apparatus of claim 1, wherein the resiliently compressible EMI gasket includes an opening along an upper portion thereof, and wherein the heat sink includes a lid portion disposed over the opening of the resiliently compressible EMI gasket such that the resiliently compressible EMI gasket and the lid portion of the heat sink cooperatively shield the one or more electrical components within the interior defined by the perimeter of the resiliently compressible EMI gasket and the lid portion of the heat sink.

10. The apparatus of claim 1, wherein the resiliently compressible EMI gasket comprises electrically-conductive elastomer.

11. The apparatus of claim 10, wherein the electrically-conductive elastomer is at least one of molded to, adhesively bonded to, or dispensed upon a lower surface portion of the heat sink.

12. The apparatus of claim 1, further comprising a thermal interface configured to be sandwiched under pressure between the heat sink and the one or more electrical components when the feet are engaged with the board.

13. The apparatus of claim 12, wherein the thermal interface comprises thermally-conductive elastomer.

14. The apparatus of claim 13, wherein the thermally-conductive elastomer is at least one of molded to, adhesively bonded to, or dispensed upon a lower surface portion of the heat sink.

15. The apparatus of claim 12, further comprising a carrier having an upper surface portion and lower surface portion, wherein the resiliently compressible EMI gasket is disposed at least partially along the carrier's lower surface portion, and wherein the thermal interface is disposed at least partially along the carrier's upper or lower surface portion.

16. The apparatus of claim 12, wherein the resiliently compressible EMI gasket comprises electrically-conductive elastomer that is at least one of molded to, adhesively bonded to, or dispensed upon the carrier's lower surface portion, and wherein the thermal interface comprises thermally-conductive elastomer that is at least one of molded to, adhesively bonded to, or dispensed upon the carrier's upper or lower surface portion.

17. The apparatus of claim 1, further comprising a sheet metal carrier coupled to the resiliently compressible EMI gasket and configured for helping the resiliently compressible EMI gasket maintain a plan-view shape after being compressed upon engagement of the spring clip's feet with the board.

18. An electronic device including the apparatus of claim 1.

19. The apparatus of claim 2, wherein at least a portion of at least one of the hook-shaped members defines at least a portion of at least one lower stop.

20. The apparatus of claim 3, wherein an upper portion of at least one of the U-shaped members defines at least a portion of at least one lower stop.

21. The apparatus of claim 1, wherein the legs have sufficient length for positioning the legs generally around sides of the board.

22. A spring clip for a low-profile board level EMI shielding and heat dissipation apparatus, the spring clip comprising resilient legs downwardly depending from a connecting member, the connecting member and resilient legs cooperatively defining a generally inverted U-shaped profile, the resilient legs having feet for engaging a board, the connecting member being resiliently biased to have a first generally concave configuration when the feet are disengaged from the board and to flex into a second generally flat configuration when the feet are engaged with the board, whereby flexing of the connecting member into the second generally flat configuration can generate a clamping force generally between the connecting member and the board, wherein the legs include upper and lower stops configured for cooperatively capturing at least a portion of the board therebetween, and wherein the feet are configured for positioning through corresponding holes in the board to thereby allow the upper and lower stops to be positioned along generally opposite upper and lower surface portions of the board.

23. The spring clip of claim 22, wherein the resilient legs extend generally outwardly and downwardly from the connecting member, the outward flaring of the resilient legs allowing the resilient legs to become generally vertical when the connecting member is flexed into the second generally flat configuration.

24. The spring clip of claim 22, wherein the connecting member includes generally opposing side edges, and wherein at least two resilient legs downwardly depend from each said side edge.

25. The spring clip of claim 24, wherein the connecting member includes a semicircular cutout portion along at least one of said side edges generally between the at least two resilient legs downwardly depending from the at least one of said side edges.

26. The spring clip of claim 22, wherein the feet include generally hook-shaped members configured to be hooked generally under a lower portion of the board.

27. The spring clip of claim 26, wherein at least a portion of at least one of the hook-shaped members defines at least a portion of at least one lower stop.

28. The spring clip of claim 22, wherein the legs have sufficient length for positioning the legs generally around sides of the board.

29. A method of providing board level EMI shielding and dissipating heat from one or more electrical components of a board, the method comprising positioning a generally inverted U-shaped spring clip having resilient legs relative to the board to engage feet of the resilient legs with the board, the engagement of the feet with the board applying a clamping force that compressively biases a heat sink and an EMI gasket having a perimeter disposed generally about the one or more electrical components generally towards the board, wherein the resilient legs include upper and lower stops, and wherein sliding and engaging the feet includes positioning the upper and lower stops along generally opposite upper and lower surface portions of the board, and slidably moving the spring dip relative to the board to capture the upper and lower surface portions of the board generally between the upper and lower stops.

30. The method of claim 29, wherein positioning the spring clip includes sliding the feet through corresponding holes in the board and engaging the feet with a lower portion of the board.

31. The method of claim 30, wherein the feet are generally U-shaped, and wherein engaging the feet includes hooking the U-shaped feet generally under the lower portion of the board.

32. The method of claim 26, wherein the resilient legs are connected by a connecting member having a first generally concave configuration when the feet are disengaged from the board, and wherein engaging the feet with the board includes flexing the connecting member from the first generally concave configuration to a second generally flat configuration, the connecting member being resiliently biased such that flexing into the second generally flat configuration generates a compressive clamping force applied generally between the connecting member and the board.

33. The method of claim 29, wherein the resilient legs are connected by a connecting member having a first configuration when the feet are disengaged from the board, and wherein engaging the feet with the board includes flexing the connecting member from the first configuration to a second configuration, the connecting member being resiliently biased such that flexing into the second configuration generates a compressive clamping force applied generally between the connecting member and the board.

34. The method of claim 29, further comprising positioning a lid portion of the heat sink over an opening of the resiliently compressive EMI gasket such that the resiliently compressible EMI gasket and the lid portion of the heat sink cooperatively shield the one or more electrical components within the interior defined by the perimeter of the resiliently compressible EMI gasket and the lid portion of the heat sink, and wherein the engagement of the feet with the board applies a clamping force for compressively biasing the lid portion of the heat sink generally towards the resiliently compressible EMI gasket.

35. The method of claim 29, further comprising positioning a thermal interface to be sandwiched under pressure between the heat sink and the one or more electrical components when the spring clip's feet are engaged with the board.

36. The method of claim 35, wherein the thermal interface comprises thermally-conductive elastomer, and wherein the EMI gasket comprises electrically-conductive elastomer.

* * * * *